(12) United States Patent
Hart et al.

(10) Patent No.: US 9,960,227 B2
(45) Date of Patent: May 1, 2018

(54) REMOVAL OF ELECTROSTATIC CHARGES FROM INTERPOSER FOR DIE ATTACHMENT

(71) Applicant: Xilinx, Inc., San Jose, CA (US)

(72) Inventors: Michael J. Hart, Palo Alto, CA (US); James Karp, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days. days.

(21) Appl. No.: 14/024,543

(22) Filed: Sep. 11, 2013

(65) Prior Publication Data
US 2015/0069577 A1    Mar. 12, 2015

(51) Int. Cl.
*H01L 23/48* (2006.01)
*H01L 23/544* (2006.01)
(Continued)

(52) U.S. Cl.
CPC .......... *H01L 29/02* (2013.01); *H01L 21/4846* (2013.01); *H01L 21/78* (2013.01); *H01L 22/32* (2013.01); *H01L 23/3128* (2013.01); *H01L 23/481* (2013.01); *H01L 23/585* (2013.01); *H01L 23/60* (2013.01); *H01L 24/05* (2013.01); *H01L 24/13* (2013.01); *H01L 24/94* (2013.01); *H01L 25/042* (2013.01);
(Continued)

(58) Field of Classification Search
CPC ......... H01L 24/19; H01L 24/94; H01L 24/97; H01L 22/32; H01L 22/34; H01L 2224/94; H01L 2224/97; H01L 25/0655; H01L 24/05; H01L 24/13; H01L 23/3128; H01L 23/481; H01L 25/50; H01L 25/0657; H01L 2225/1041; H01L 2225/107; H01L 21/4846–21/4867; H01L 21/4807–21/481; H01L 21/78; H01L 25/042; H01L 25/072; H01L 25/0753; H01L 25/115; H01L 25/0652; H01L 23/60; H01L 23/498–23/49894; H01L 23/538–23/5389
USPC .......................................... 257/620; 438/462
See application file for complete search history.

(56) References Cited

U.S. PATENT DOCUMENTS 5,206,181 A * 4/1993 Gross .............................. 438/18
5,354,955 A * 10/1994 Gregor .................. H01L 21/485
                                                                174/250

(Continued)

FOREIGN PATENT DOCUMENTS

EP          1 017 094 A2      7/2000

OTHER PUBLICATIONS

McAteer, Owen J., "Electrostatic Discharge Control", Chapter Fifteen, p. 414, McGraw-Hill, NY, 1989.
(Continued)

*Primary Examiner* — Jeremy Joy
(74) *Attorney, Agent, or Firm* — Kevin T. Cuenot; Robert M. Brush

(57) ABSTRACT

A wafer includes a first interposer having a first patterned metal layer and a second interposer having a second patterned metal layer. The wafer includes a metal connection in a scribe region of the wafer that electrically couples the first patterned metal layer of the first interposer with the second patterned metal layer of the second interposer forming a global wafer network. The wafer further includes a probe pad located in the scribe region that is electrically coupled to the global wafer network.

11 Claims, 12 Drawing Sheets

(51) Int. Cl.

| | | |
|---|---|---|
| *H01L 23/58* | (2006.01) | |
| *H01L 23/52* | (2006.01) | |
| *H01L 29/02* | (2006.01) | |
| *H01L 21/78* | (2006.01) | |
| *H01L 23/00* | (2006.01) | |
| *H01L 23/31* | (2006.01) | |
| *H01L 25/00* | (2006.01) | |
| *H01L 25/065* | (2006.01) | |
| *H01L 25/07* | (2006.01) | |
| *H01L 25/11* | (2006.01) | |
| *H01L 25/075* | (2006.01) | |
| *H01L 21/48* | (2006.01) | |
| *H01L 25/04* | (2014.01) | |
| *H01L 21/66* | (2006.01) | |
| *H01L 23/60* | (2006.01) | |
| *H01L 23/498* | (2006.01) | |

(52) U.S. Cl.
CPC ...... *H01L 25/0652* (2013.01); *H01L 25/0655* (2013.01); *H01L 25/0657* (2013.01); *H01L 25/072* (2013.01); *H01L 25/0753* (2013.01); *H01L 25/115* (2013.01); *H01L 25/50* (2013.01); *H01L 23/49827* (2013.01); *H01L 24/81* (2013.01); *H01L 24/97* (2013.01); *H01L 2224/16225* (2013.01); *H01L 2224/16227* (2013.01); *H01L 2224/752* (2013.01); *H01L 2224/81192* (2013.01); *H01L 2224/97* (2013.01)

(56) References Cited

U.S. PATENT DOCUMENTS

| | | | |
|---|---|---|---|
| 6,121,677 A * | 9/2000 | Song | H01L 22/32 257/48 |
| 6,159,826 A * | 12/2000 | Kim | H01L 21/78 257/E21.599 |
| 6,365,975 B1 * | 4/2002 | DiStefano | H01L 23/498 257/685 |
| 6,753,595 B1 | 6/2004 | Lin et al. | |
| 6,836,397 B2 | 12/2004 | Chen et al. | |
| 7,378,735 B2 | 5/2008 | Lin | |
| 7,795,713 B2 | 9/2010 | Matsui | |
| 8,030,775 B2 | 10/2011 | Lin | |
| 8,674,507 B2 | 3/2014 | Chou et al. | |
| 8,866,229 B1 | 10/2014 | Fakhruddin | |
| 9,106,229 B1 * | 8/2015 | Hutton | H03K 19/173 |
| 9,252,030 B1 * | 2/2016 | Jin | H01L 21/563 |
| 9,337,138 B1 | 5/2016 | Abugharbieh et al. | |
| 9,653,427 B2 * | 5/2017 | Wu | H01L 25/0652 |
| 2002/0168798 A1 | 11/2002 | Glenn et al. | |
| 2003/0234393 A1 * | 12/2003 | Cowles | G01R 31/2884 257/48 |
| 2004/0056339 A1 | 3/2004 | Troost | |
| 2004/0227163 A1 * | 11/2004 | Sakamoto | H01L 24/02 257/207 |
| 2004/0256717 A1 * | 12/2004 | Suenaga | H01L 23/49822 257/700 |
| 2007/0152316 A1 * | 7/2007 | Ryu | H01L 22/32 257/686 |
| 2008/0017856 A1 * | 1/2008 | Fujino | G01R 31/2884 257/48 |
| 2008/0203567 A1 | 8/2008 | Kondo | |
| 2008/0251788 A1 * | 10/2008 | Maruyama | G01R 31/2884 257/48 |
| 2008/0265421 A1 | 10/2008 | Brunnbauer et al. | |
| 2008/0284037 A1 * | 11/2008 | Andry | H01L 21/6835 257/774 |
| 2009/0079071 A1 * | 3/2009 | Webb | H01L 23/49822 257/738 |
| 2009/0180225 A1 | 7/2009 | Pan et al. | |
| 2009/0262475 A1 | 10/2009 | Darabi et al. | |
| 2009/0315157 A1 | 12/2009 | Drost et al. | |
| 2010/0103058 A1 | 4/2010 | Kato et al. | |
| 2010/0164053 A1 * | 7/2010 | Furumiya | G01R 31/2884 257/503 |
| 2010/0258949 A1 * | 10/2010 | Henderson | H01L 21/67092 257/777 |
| 2011/0260318 A1 | 10/2011 | Eisenstadt | |
| 2011/0316572 A1 * | 12/2011 | Rahman | G01R 31/2853 324/754.03 |
| 2012/0002392 A1 | 1/2012 | Karp | |
| 2012/0049389 A1 | 3/2012 | Verma et al. | |
| 2012/0133032 A1 | 5/2012 | Tsai et al. | |
| 2012/0153433 A1 | 6/2012 | Yen et al. | |
| 2012/0182650 A1 | 7/2012 | Chi | |
| 2012/0319717 A1 | 12/2012 | Chi | |
| 2013/0027073 A1 | 1/2013 | Pagani et al. | |
| 2013/0063843 A1 * | 3/2013 | Chen | H01L 23/552 361/56 |
| 2013/0200509 A1 | 8/2013 | Kim | |
| 2013/0200511 A1 * | 8/2013 | Banijamali | H01L 25/0652 257/737 |
| 2013/0256913 A1 | 10/2013 | Black | |
| 2013/0307143 A1 * | 11/2013 | Lin | H01L 24/19 257/737 |
| 2014/0002122 A1 * | 1/2014 | Dibattista | G01R 31/318511 324/750.24 |
| 2014/0042643 A1 * | 2/2014 | Yu | H01L 21/486 257/777 |
| 2014/0167799 A1 | 6/2014 | Wang | |
| 2015/0014863 A1 * | 1/2015 | Shih | H01L 24/94 257/777 |
| 2015/0327367 A1 * | 11/2015 | Shen | H05K 1/111 361/767 |

OTHER PUBLICATIONS

U.S. Appl. No. 13/898,895, James Karp, filed May 21, 2013, San Jose, CA US.

* cited by examiner

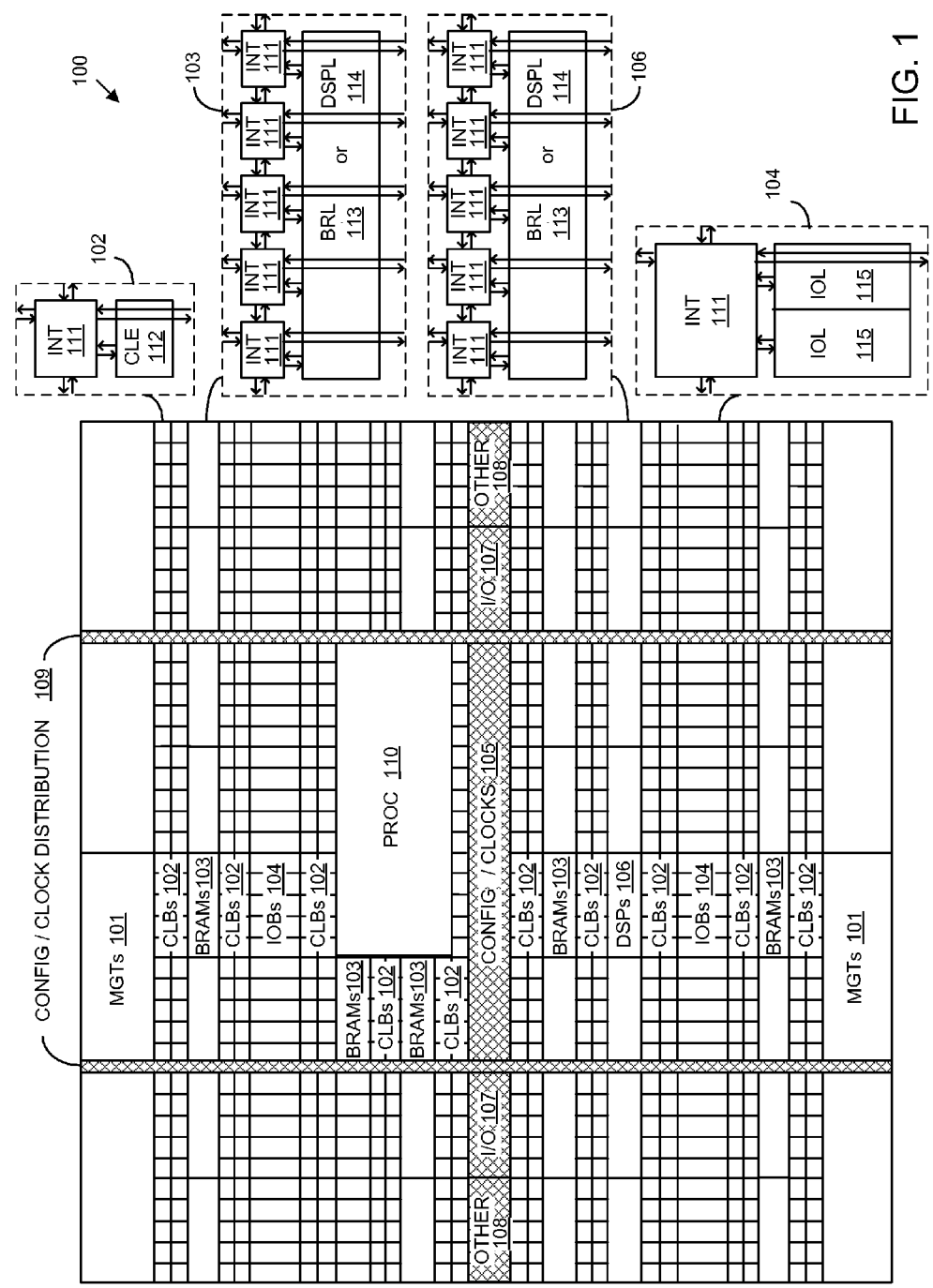

REMOVAL OF ELECTROSTATIC CHARGES FROM INTERPOSER FOR DIE ATTACHMENT

FIELD OF THE INVENTION

This specification relates to integrated circuits (ICs) and, more particularly, to removal of electrostatic charges from interposers for die attachment during assembly of a multi-die IC.

BACKGROUND

Integrated circuits (ICs) have become more "dense" over time as device sizes continue to shrink. A modern IC having a die of a given size will generally include a greater number of devices than an older IC having a die of the same size due to smaller device size and increased device density. Increased device density, however, can lead to manufacturability issues that can reduce yield and/or reliability of the IC. This may be particularly true of single die ICs.

Multi-die ICs can provide benefits in terms of improved manufacturability. One type of multi-die IC, referred to as a "stacked die IC," is formed by stacking multiple dies. When viewed against a comparable single die IC, a stacked die IC potentially allows for lower power consumption, less current leakage, greater performance, and/or smaller size among other benefits. Still, there are risks associated with the assembly of stacked die ICs that are not of concern for single die ICs. These risks also may reduce yield and/or reliability of stacked die ICs.

SUMMARY

One aspect of the inventive arrangements includes a wafer. The wafer includes a first interposer. The first interposer includes a first patterned metal layer. The wafer further includes a second interposer. The second interposer includes a second patterned metal layer. The wafer also includes a metal connection in a scribe region of the wafer that electrically couples the first patterned metal layer of the first interposer with the second patterned metal layer of the second interposer forming a global wafer network. A probe pad is also included in the wafer. The probe pad is located in the scribe region and is electrically coupled to the global wafer network.

Another aspect of the inventive arrangements includes a method. The method includes forming a first interposer on a wafer. The first interposer includes a first patterned metal layer having a first metal stub extending into a scribe region of the wafer. The method also includes forming a second interposer on the wafer adjacent to the first interposer. The second interposer includes a second patterned metal layer having a second metal stub extending into the scribe region of the wafer and contacting the first metal stub. The first metal stub and the second metal stub form a continuous metal connection between the first patterned metal layer and the second patterned metal layer through the scribe region.

BRIEF DESCRIPTION OF THE DRAWINGS

FIGS. 2-1 through 2-3 are block diagrams depicting an exemplary process flow for formation of a stacked die IC from a side view for wafer-scale or chip-scale fabrication.

FIG. 3 is a block diagram illustrating a top view of an exemplary interposer wafer.

FIGS. 4-1 and 4-2 are block diagrams each illustrating a cross-sectional side view of an exemplary portion of a stacked die IC.

FIGS. 5-1 and 5-2 are block diagrams each illustrating a cross-sectional side view of an exemplary portion of an interposer.

FIGS. 8-1 through 8-3 are block diagrams illustrating exemplary techniques for forming a metal connection between adjacent interposers in an interposer wafer.

DETAILED DESCRIPTION OF THE DRAWINGS

Figure 2:
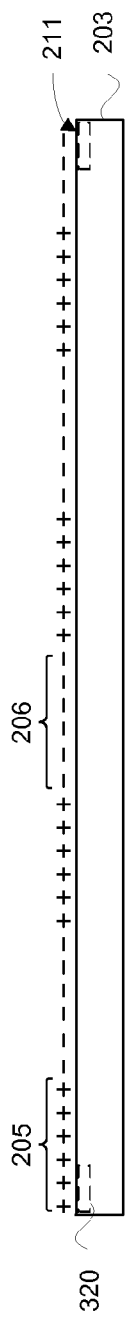

While the specification concludes with claims defining novel features, it is believed that the various features disclosed within this specification will be better understood from a consideration of the description in conjunction with the drawings. The process(es), machine(s), manufacture(s) and any variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure. Further, the terms and phrases used within this specification are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

This specification relates to integrated circuits (ICs) and, more particularly, to removing electrostatic charge from interposers for die attachment during assembly of a multi-die IC. A multi-die IC is an IC formed of two or more dies that operate cooperatively within a single package. One type of multi-die IC is referred to as a stacked die IC. Typically, a stacked die IC includes an interposer die (interposer) to which one or more other dies are attached or coupled. Often, the interposer is implemented as a passive die to improve the cost effectiveness of the stacked die IC. A passive die is a die without any active devices, e.g., without any p-n or n-p junctions. Within this specification, the term "die" refers to an "integrated circuit die."

An interposer, being a passive die, may not have any conventional electrostatic discharge (ESD) protection. Adding conventional ESD protection to an interposer may add considerable cost to formation of the interposer. During fabrication and assembly, interposers may be exposed to processing which uses substantial ionic charges, such as plasma discharges, for example, as well as ESD from handling. Because interposers may collect charged particles, the interposers may be a source of discharge to a die to be attached thereto. A bare die may not have all of its pins protected and/or sufficiently protected against one or more of such discharges. As such, the die may be damaged by a discharge of interposer surface charge to the die during assembly.

In fact, during assembly of stacked die ICs, the dies that are to be stacked are, from an electrical viewpoint, floating immediately prior to being placed in mechanical and electrical contact with one another. The electrostatic charge that accumulates on one or both dies must be safely discharged before the dies are placed in such contact with one another to avoid damaging the dies and the resulting stacked die IC.

In one aspect, an interposer upon which other dies are attached may be formed with one or more probe pads that facilitate grounding of the interposer during the die attachment process. A probe or probe pin (hereafter collectively "probe") may be grounded and put in contact with the probe pad implemented on the interposer prior to attaching any other die to the interposer. The grounded probe may be removed from contacting the probe pad when no further dies are to be attached to the interposer as part of the die attachment process.

In another aspect, one or more patterned metal layers of multiple interposers are connected together while the interposers are still in wafer form. For example, one or more patterned metal layers, or portions thereof, of each interposer of a wafer can be interconnected using metal connections that are formed within or through scribe regions of the wafer. Connecting the patterned metal layers in this manner forms a global wafer network. Accordingly, rather than placing a probe pad on each interposer individually, a probe pad is formed that, when placed in mechanical contact with a grounded probe, allows each interposer on the wafer to be grounded from that single contact with the probe pad.

In either case, the interposer(s) are grounded using the probe pad to safely discharge any accumulation of electrostatic charge. When a die is put in contact with the interposer to assemble the stacked die IC, the likelihood of damage to either die and/or the resulting stacked die IC from ESD is significantly reduced from contacting the probe pad(s) with the grounded probe.

This specification describes methods, systems, and apparatus relating to the formation of structures that facilitate safe discharge of accumulated electrostatic charge during assembly of multi-die ICs. The structures can be implemented within dies that are to be assembled into stacked die ICs and/or within wafers of dies to be used in assembly of stacked die ICs. Further, methods, systems, and apparatus are described relating to the assembly of a stacked die IC in which one or more of the dies to be assembled and/or the wafers of dies incorporate the noted structures.

With the above general understanding borne in mind, various features of interposers, and the formation thereof, are generally described below. In addition, a detailed description of programmable ICs is provided below. While aspects of the inventive arrangements disclosed herein can be utilized with programmable ICs, it should be appreciated that other types of ICs may benefit from one or more of the techniques described within this specification.

Programmable ICs are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth.

Each programmable tile typically includes both programmable interconnect(s) and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells that determine the function of the FPGA.

Another type of programmable IC is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" includes, but is not limited to, these exemplary devices.

The phrase "programmable IC" further may encompass devices that are only partially programmable. For example, one type of programmable IC includes a combination of hard-coded transistor logic and a programmable switch fabric that programmably interconnects the hard-coded transistor logic. Another type of programmable IC is an Application Specific Integrated Circuit (ASIC) that includes at least some programmable interconnect and/or programmable logic portions.

Figure 1:
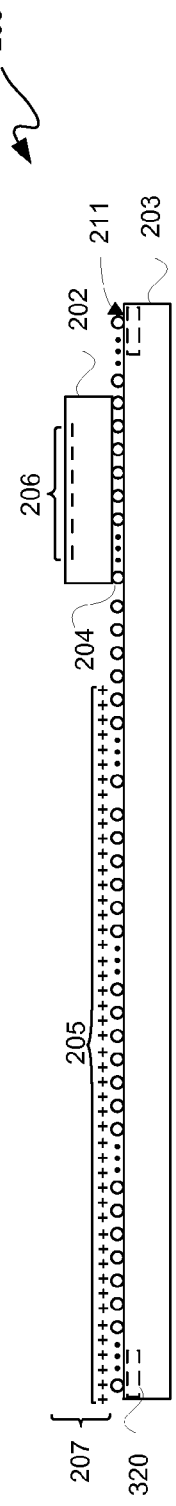
FIG. 1 is a simplified block diagram depicting an exemplary architecture for a programmable integrated circuit (IC).

FIG. 1 is a block diagram depicting an exemplary architecture 100 for an IC. In one aspect, architecture 100 is implemented within an FPGA type of programmable IC. As shown, architecture 100 includes several different types of programmable circuit, e.g., logic, blocks in the array. For example, architecture 100 includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable logic 108 such as digital clock managers, analog-to-digital converters, system monitoring logic, and so forth. Architecture 100 also can include a dedicated processor block (PROC) 110.

Within architecture 100, each programmable tile can include a programmable interconnect element (INT) 111 having standardized connections to and from a corresponding INT 111 in each adjacent tile. Therefore, INTs 111, taken together, implement the programmable interconnect structure for architecture 100. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. As pictured, a BRAM tile has the same height as five CLBs, but other numbers (e.g., four) can also be used. A DSP tile 106 can include a DSP logic element (DSPL) 114 in addition to an appropriate number of INTs 111. An 10B 104 can include, for example, two instances of an input/output logic element (IOL) 115 in addition to one instance of an INT 111. As will be clear to those of skill in the art, the actual I/O pads connected, for example, to the I/O logic element 115 typically are not confined to the area of IOL 115.

In the example pictured in FIG. 1, a horizontal area near the center of the die, e.g., formed of regions 105, 107, and 108, is used for configuration, clock, and other control logic. Vertical columns 109 extending from this horizontal area are used to distribute the clocks and configuration signals across the breadth of the IC.

Some ICs utilizing architecture 100 include additional logic blocks that disrupt the regular columnar structure making up a large part of the IC. The additional logic blocks can be programmable blocks and/or dedicated circuitry, e.g., logic. For example, a processor block such as PROC 110 spans several columns of CLBs and BRAMs.

FIG. 1 is intended to illustrate only an exemplary architecture that can be used to implement an IC that includes programmable circuitry. For example, the number of circuit blocks (or tiles) in a row, the relative width of the rows, the number and order of rows, the types of circuit blocks included in the rows, the relative sizes of the circuit blocks, and the interconnect/logic implementations included at the top of FIG. 1 are purely exemplary. In an actual FPGA, for example, more than one adjacent row of CLBs is typically included wherever the CLBs appear to facilitate the efficient implementation of user logic and/or circuit designs. Further, the number of adjacent CLB rows will vary with the overall size of the FPGA.

While the description that follows references FPGAs and/or other system-on-chips as being implemented in a stacked die IC configuration, it should be appreciated that the inventive arrangements disclosed within this specification are not intended to be so limited. Rather, the following description may be applied to any stacked die IC structure having a die, e.g., an interposer, with one or more other dies stacked thereon.

Figure 3:
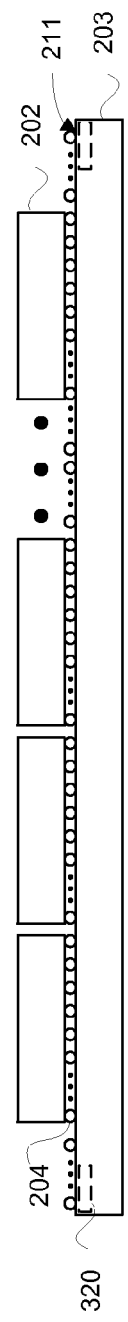
Figure 3:
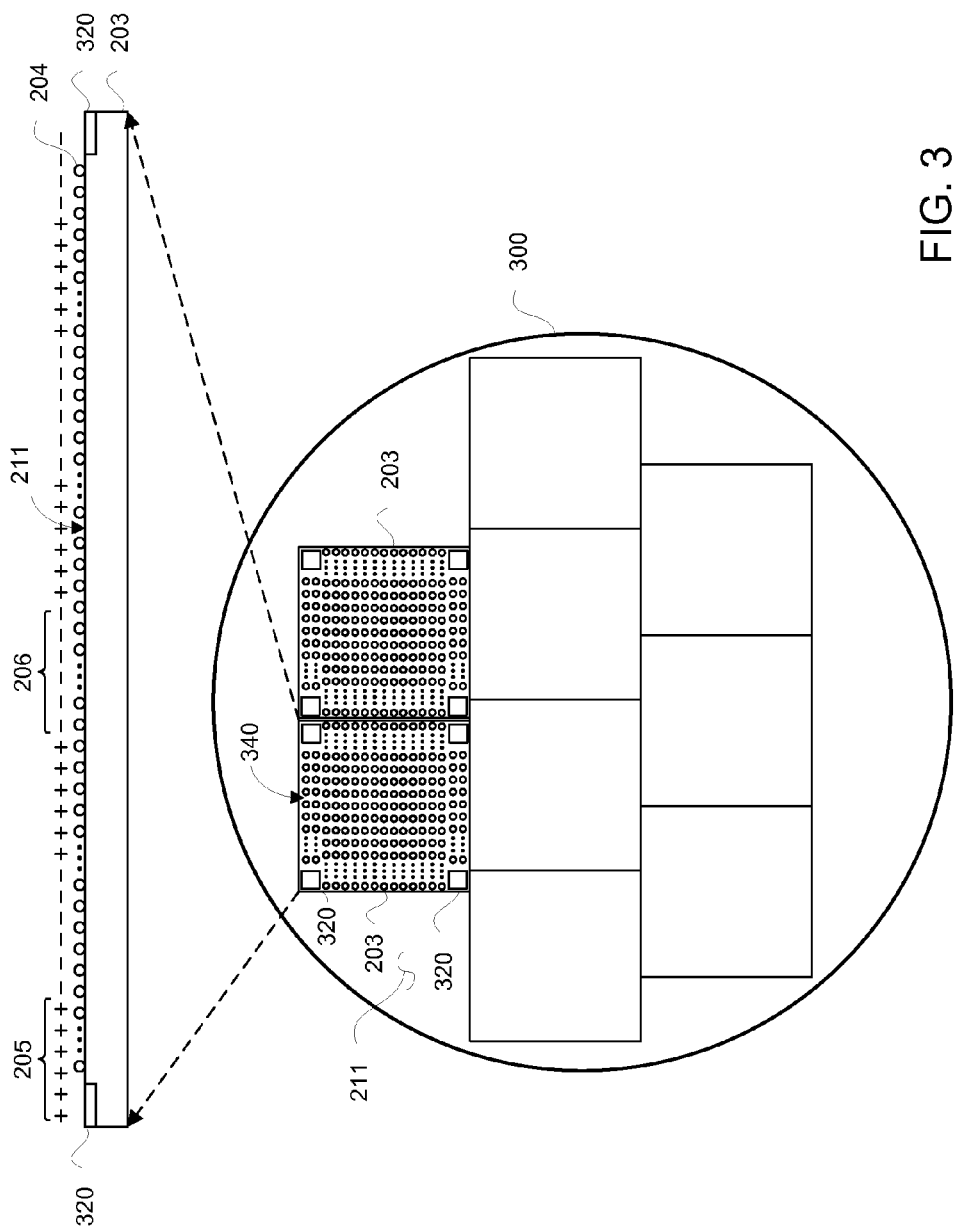

FIGS. 2-1 through 2-3 are block diagrams depicting an exemplary process flow for formation of a stacked die IC 200 from a side view for wafer-scale or chip-scale fabrication. With simultaneous reference to FIGS. 2-1 through 2-3, charges, such as generally depicted as positive charges 205 and negative charges 206, may collect on a front side surface 211 of interposer 203. Interposer 203 includes one or more probe pads 320.

As used within this specification, a "probe pad" refers to any IC structure that is configured for making contact with a probe. In this regard, a probe pad is large enough in size so that a probe can make mechanical and, as such, electrical, contact with the IC structure. Accordingly, a probe pad may be constructed using any of a variety of known IC structures, a plurality of IC structures in close proximity to one another, etc., as described in further detail within this specification.

An interposer 203 has a top or front side surface 211 to which one or more dies 202 may be coupled, such as via micro bumps 204 for example. Dies 202 may include one or more of an FPGA die, a power supply die, a memory die, an optical interface die, a graphics processor die, and/or any other type or types of die. One or more of such dies 202 may be susceptible to damage from surface charge discharge from interposer 203, as described below in additional detail. When attached to interposer 203, one or more dies 202 may have been previously tested, namely may be a "known good die." Thus, damage to a known good die may be linked to a die attach operation.

Interposer 203 may still be part of an interposer wafer, as described below in additional detail. In other words, an interposer wafer may or may not have been diced at this juncture. This is generally referred to as a chip-on-wafer flow or CoW flow. Optionally, interposer 203 may have been diced from an interposer wafer at this juncture, and then have one or more dies attached thereto. This is generally referred to as a chip-on-chip flow or CoC flow. In either of such flows, an under fill may be injected between dies and a mold compound may be used to effectively bind together dies 202. Such under fill and mold compound, however, are not illustratively depicted here for purposes of clarity and not limitation. Furthermore, for purposes of clarity and not limitation, it shall be assumed that a CoW flow is used, even though either a CoW flow or a CoC flow may be used.

Interposer 203 may include a substrate. For purposes of clarity and not limitation, a silicon substrate may be used. In other instances, however, another type of material or combination of materials may be used as a semiconductor substrate. Furthermore, in yet other instances, a dielectric substrate, such as a silicon oxide or other dielectric substrate for example, may be used for interposer 203. Conductive layers, such as horizontal metal layers and/or vertical via layers, may be insulated from one another by inter-dielectric layers (ILDs). Whether a dielectric or semiconductor substrate is used for interposer 203, the substrate may be subject to an electrical floating body effect. The following description is applicable to either or both a dielectric or semiconductor substrate for interposer 203.

A portion of micro bumps 204 may be for interconnects for electrical conductivity with one or more of dies 202. These interconnects may include one or more ground buses or networks and one or more power buses or networks. For purposes of clarity and not limitation, a single ground network and a single supply voltage network are described below in additional detail. However, multiple power and/or ground networks may be included in interposer 203.

With reference to FIG. 2-2, when an initial die 202 is coupled to interposer 203 via micro bumps 204, it may be susceptible to a large positive charge from positive surface charge 205. In other words, such initial die 202 may see the entirety of surface charge 205. For purposes of clarity by way of example and not limitation, an initial die 202 may have a negative charge 206 that, when combined with a positive surface charge 205, a potential difference 207 may result. This potential difference 207 may cause an ESD or other electrical discharge into such initial die 202. Such discharge may render one or more devices of die 202 inoperable and/or may significantly damage one or more devices such that the device(s) do not properly work or are unreliable.

It should be appreciated that if surface charge were negative and die 202 had a positive charge, then potential difference 207 would be of an opposite polarity. More particularly, such ESD or other electric discharge would be in a direction away from die 202. Such a discharge is more likely to have a negative impact on interposer 203 than on die 202. The following description is applicable to either or both directions of electrical discharge. For purposes of clarity and not limitation, however, protection of dies 202 is generally described below. One or more dies 202 may be coupled to interposer 203 via micro bumps 204. In general, however, a first one or two coupled dies 202 will bear the brunt of any ESD events.

During fabrication of a stacked die IC 200, sometimes referred to as Stacked Silicon Interconnect Technology (SSIT), an interposer or interposer wafer may be exposed to charged particles. These charged particles may be positive and/or negative. Such charges may come from any of a number of possible sources, including without limitation exposure to a plasma of a plasma-enhanced chemical vapor deposition (PECVD), exposure to a plasma of plasma etch (dry etch), and/or electrostatic discharge from handling, among other possible sources of exposure to charged particles.

These charges 205 and/or 206 may result in a potential difference 207 between a front side surface 211 and source-drain junctions, or more generally p-n or n-p junctions of transistors and other devices formed in one or more of dies 202. The term "p-n" is used interchangeably to refer to both n-p and p-n junctions unless expressly indicated otherwise.

For purposes of discussion, it is assumed that interposer 203 is a "passive" interposer. In a conventional die, transistors can be protected from plasma damage by antenna rules that limit an area ratio of metal and gate sizes. Furthermore, a conventional die may have ESD protection circuits. In the case of stacked die IC that uses a passive interposer to reduce the cost of manufacturing, the interposer includes only passive components.

For example, a passive interposer may only have micro bumps, metal interconnects, TSVs, under bump metallization (UBM), and C4 balls. These passive components may have large widths, lengths, and/or height to reduce resistance-capacitance (RC) delays. Furthermore, a high density metal layout of an interposer may make a high antenna ratio a significant risk. Accordingly, if charges 205 and/or 206 are given a conductive path to p-n junctions of die 202, such charges may cause significant damage thereby causing a device within die 202 to fail prematurely or be inoperable. Such conductive path or paths are presented during the die attachment process, when one or more of dies 202 are coupled to interposer 203.

FIG. 3 is a block diagram illustrating a top view of an exemplary interposer wafer 300. Interposer wafer 300 may include a plurality of interposers 203. A front side surface 211 of interposer wafer 300 is illustratively depicted. Even though a back side surface may have charge accumulation, front side surface 211 charge accumulation on interposer wafer 300 is more relevant to the die attachment process.

Interposer 203 has an array 340 of a plurality of conductors for coupling one or more dies 202 to interposer 203 to provide a stacked die IC, namely a stacked die IC 200. Accordingly, each of interposers 203 of interposer wafer 300 may have such an array 340 though only illustratively depicted for two of such interposers 203. Furthermore, each of interposers 203 of interposer wafer 300 may have one or more probe pads 320. Probe pads 320 may be coupled to one or more conductive networks, as described below in additional detail, of such interposers 203.

In this example, probe pads 320 are located at or on a periphery of array 340 of such plurality of conductors. More particularly, four probe pads 320 are respectively located in the four distal corners of front side surface 211 of interposers 203. However, in another example, probe pads may be located in these and/or one or more other locations on front side surface 211 of interposers 203. Furthermore, such plurality of conductors may include micro bumps 204, as more easily seen in the cross-sectional enlarged side view of FIG. 3 of an interposer 203 of interposer wafer 300. Both probe pads 320 and array 340 of micro bumps 204 may be located on a front side surface 211 of interposers 203.

Figures 1, 4:
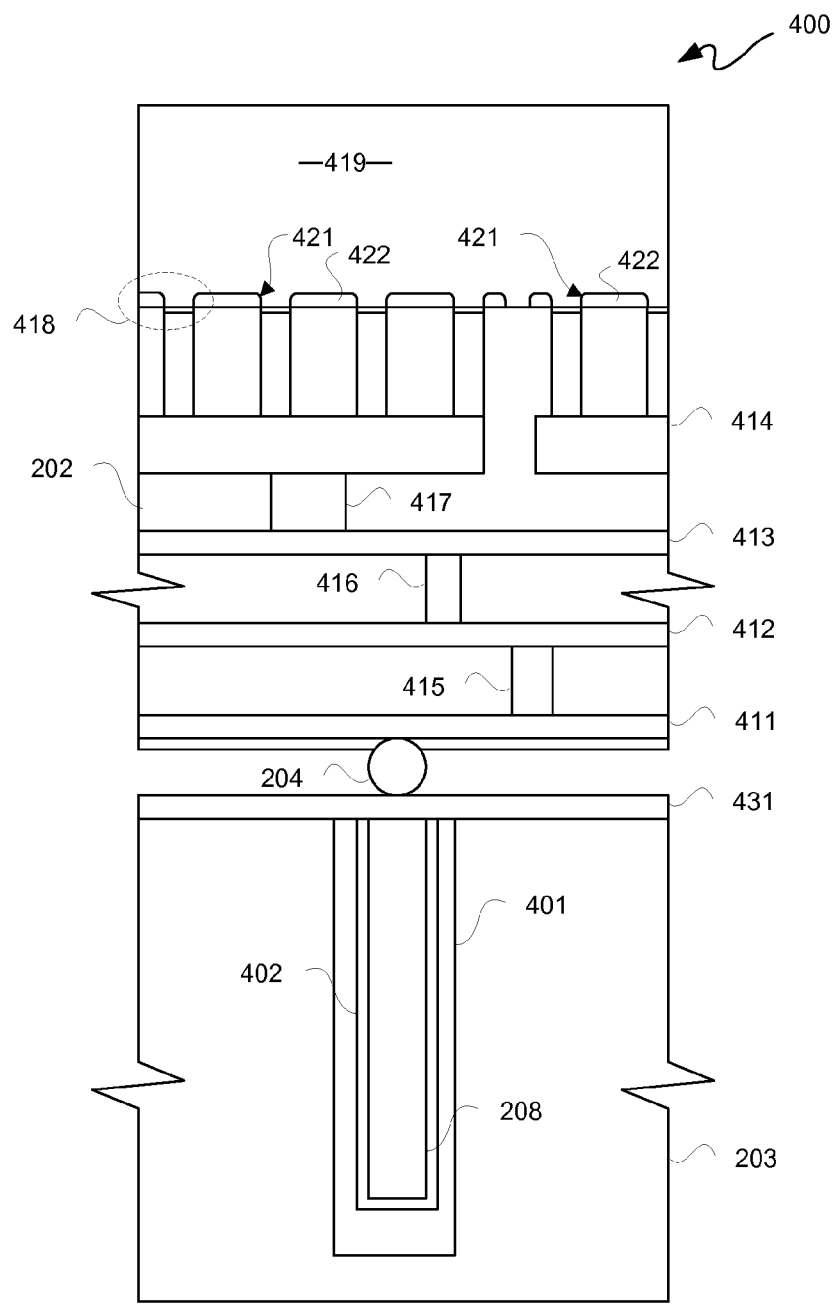
Figures 2, 4:
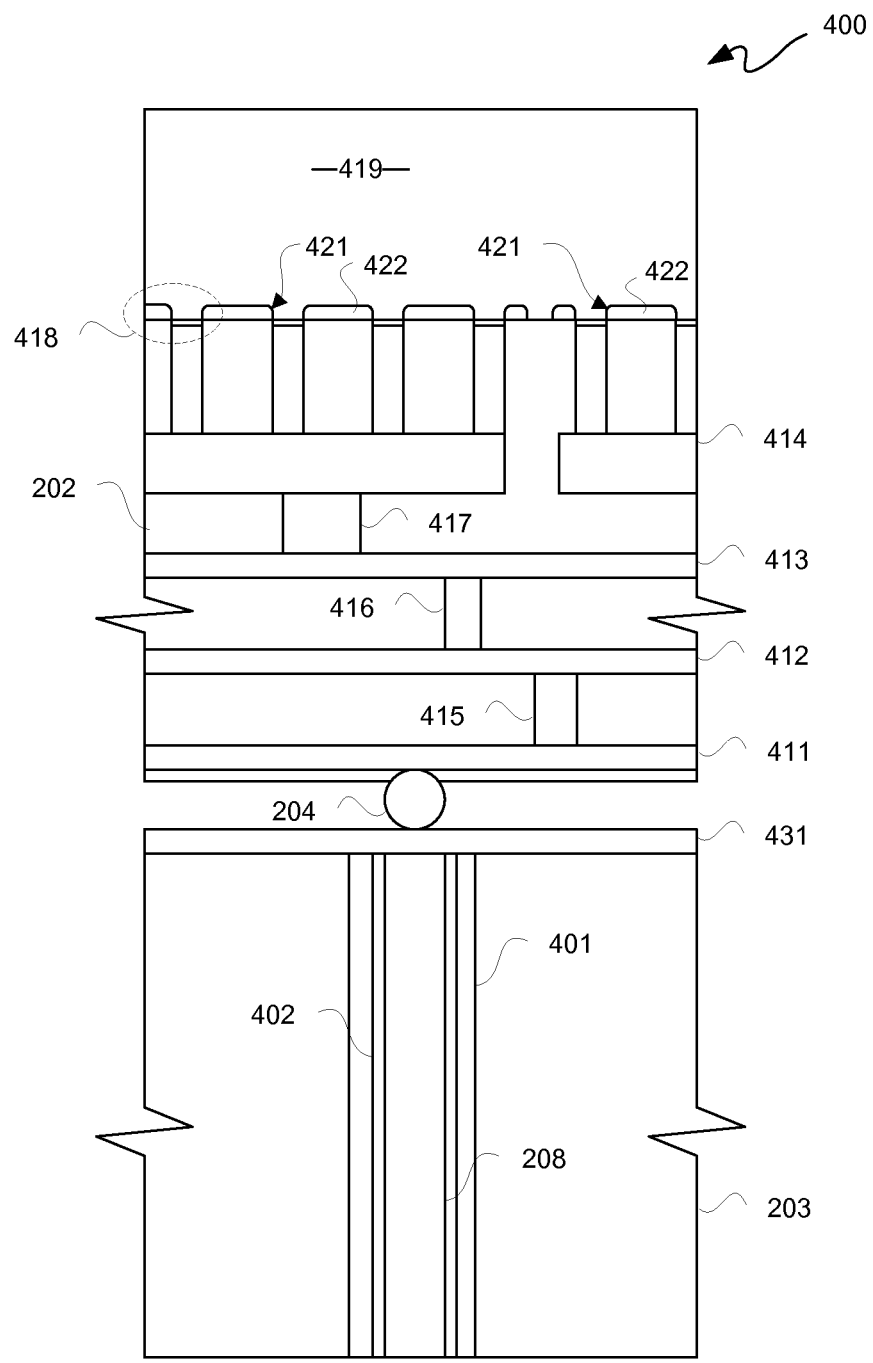

FIGS. 4-1 and 4-2 are block diagrams each illustrating a cross-sectional side view of an exemplary portion of a stacked die IC. FIG. 4-1 is an exemplary portion 400 of a stacked die IC. For example, portion 400 can be a portion of stacked die IC 200 as illustrated and described with reference to FIG. 2-2 or 2-3.

In FIG. 4-1, a through-substrate via (TSV) 208, which may be formed with copper and may have one or more barrier layers 402 and a dielectric layer 401, of an interposer 203 may be coupled to a metal layer 431 of such interposer. In the example pictured in FIG. 4-1, TSV 208 does not extend completely through interposer 203. Metal layer 431 may be coupled to a metal layer 411 of integrated circuit die 202 through a micro bump 204.

Metal layer 411 may be coupled to one or more other metal layers, such as metal layers 412 and 413, for example, through one or more metal via layers, such as via layers 415 and 416, respectively. Another via layer, such as via layer 417, may be used to couple metal layer 413 to metal layer 414. Metal layer 414 may be coupled to gate stacks, source regions, drain regions, and/or body regions of transistors 418. Substrate 419 of die 202 may have multiple p-n junctions 421 formed therein, including source and drain regions 422.

Charge may accumulate on front side surface 211 of interposer(s) 203. Accordingly, during the die attachment process where one or more dies 202 are attached through micro bumps 204 to interposer 203 or interposer wafer 300, dies 202 and/or interposer 203 may be damaged if interposer(s) 203 are not grounded.

FIG. 4-2 illustrates an alternative, exemplary implementation of portion 400 of a stacked die IC. Portion 400 of FIG. 4-2, as was the case with FIG. 4-1, can be a portion of stacked die IC 200 as illustrated and described with reference to FIG. 2-2 or 2-3. FIG. 4-2 is substantially similar to FIG. 4-1 and, as such, descriptions of like numbered elements generally are not repeated. FIG. 4-2, however, differs from FIG. 4-1 in that TSV 208 extends completely, or entirely, through interposer 203. Accordingly, one or more barrier layers 402 and dielectric layer 401 also extend entirely through interposer 203.

Figures 1, 5:
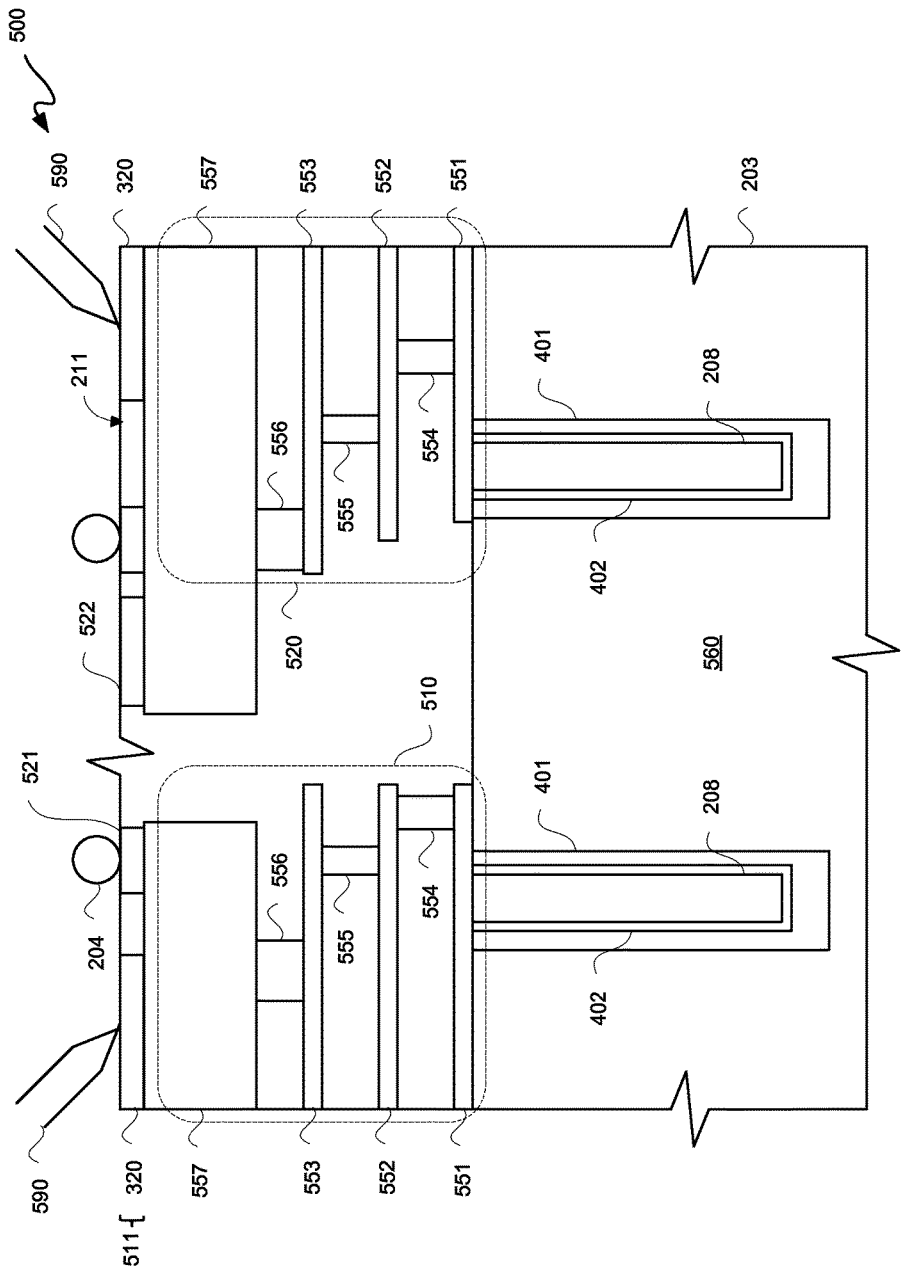
Figures 2, 5:
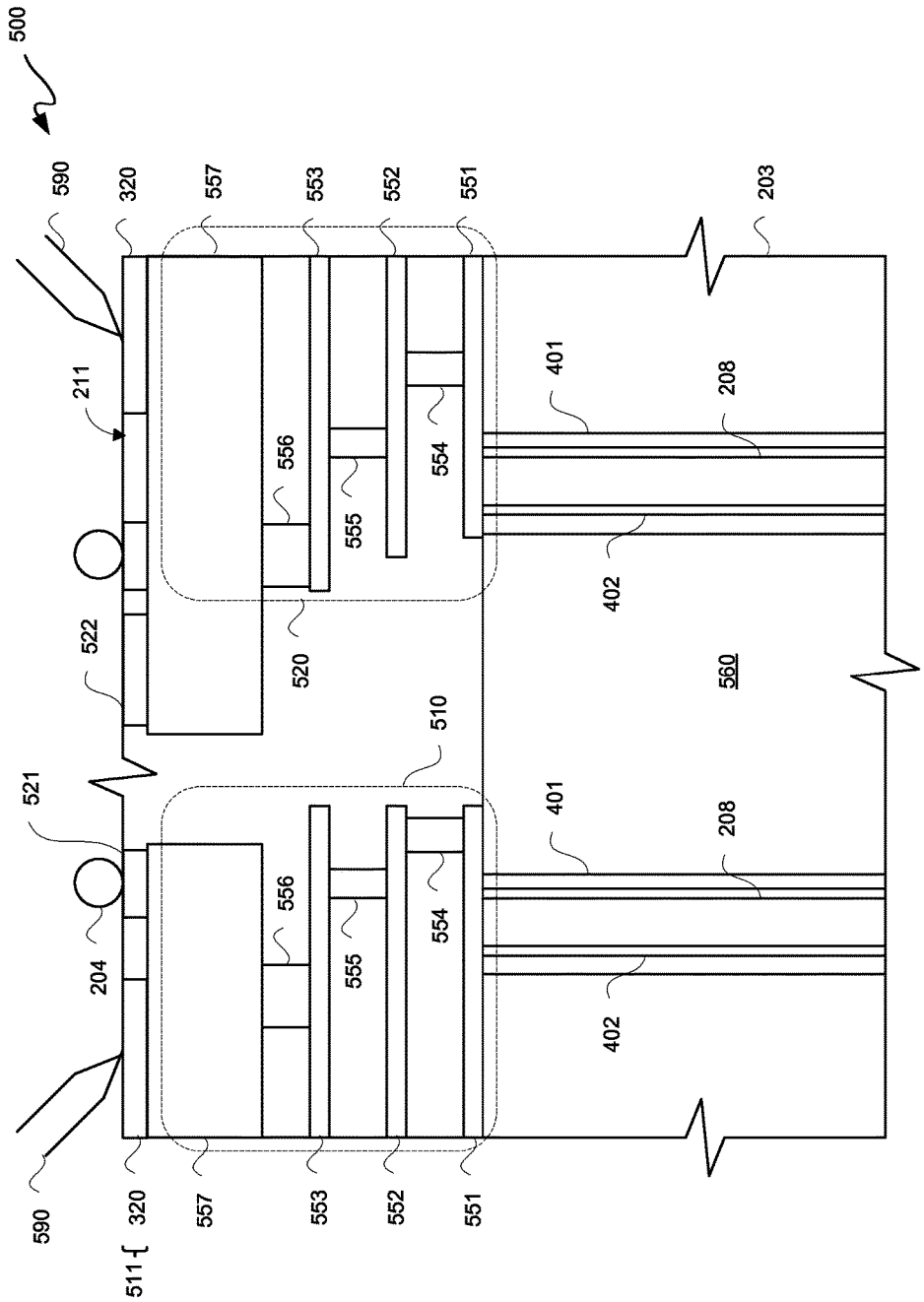

FIGS. 5-1 and 5-2 are block diagrams illustrating a cross-sectional side view of an exemplary portion of an interposer. FIG. 5-1 is an exemplary portion 500 of an interposer. Portion 500 of FIG. 5-1, for example, can represent a portion of interposer 203, which may be part of interposer wafer 300 as described with reference to FIG. 3.

Interposer 203 includes a substrate 560, which may be a semiconductor substrate or a dielectric substrate such as previously described. Multiple TSVs 208 may be formed in substrate 560, such as previously described. In the example pictured in FIG. 5-1, TSVs 208 do not extend completely through substrate 560. Interposer 203 may include multiple conductive layers. In this example, a conductive layer 551 is coupled to TSVs 208. Conductive layer 551, which may be a metal layer, may be coupled to one or more other conductive layers 552 and 553, for example, which may be metal layers, through one or more conductive via layers 554 and 555, respectively, for example. Via layers 554 and 555 may be metal via layers. Metal layers 551 through 552 and via layers 554 and 555 may all be copper-based conductive layers for example. Additionally, a via layer 556 may couple conductive layer 553 to conductive layer 557. Conductive layer 557 may be coupled to probe pads 320 of a front side surface 211. Probe pads 320 may be formed of a metal layer 511 used to form pads 521 for micro bumps 204 and/or to form other pads. Conductive layer 557 and via layer 556, as well as pads 320, 521, and 522, may all be metal-based layers, such as aluminum layers for example.

In one aspect, probe pads 320 are larger than micro bumps 204 and pads 521 therefor. Probe pads 320 may be larger than or the same size as other conventional probe pads. Along those lines, a grounded probe or probe pin (grounded probe) 590 may be put in contact with a corresponding probe pad 320 to provide a reference ground prior to attaching a die 202 to interposer 203. Grounded probe 590 is not part of interposer 203, but may be put in mechanical contact with and subsequently removed from such mechanical contact with a probe pad 320 of interposer 203.

In an alternative arrangement, one or more of micro bumps 204 can function as a probe pad. In that case, the grounded probe 590 may be put in contact with a corresponding micro bump 204 or plurality of micro bumps 204 forming a probe pad to provide a reference ground prior to attaching a die 202 to interposer 203.

As interposer 203 may be electrically floating, proper grounding of interposer 203 prior to, or as part of, the die attachment process may protect one or more dies 202. As noted, charge buildup on front side surface 211 may cause damage, such as electro-migration, to die 202, and such charge buildup may be substantially dissipated by touching one or more grounded probes 590 to corresponding probe pad 320 or other probe pad as described prior to attaching such die 202 to interposer 203.

With additional reference to FIGS. 2-1 through 2-3, 3, and 4, interposer 203, or interposer wafer 300, may have surface charges 205 and/or 206. During the die attachment process, there may be a conductive path, or discharge path, to one or more p-n junctions of one or more of dies 202. Again, this discharge path may cause premature failure or inoperability of one or more devices of dies 202. Charge accumulation can be so high in some instances that transistors suffer source-drain punch through and/or silicide loss as a result of thermal "burnouts" and electro-migration, respectively. However, by grounding using one or more probe pads 320 or other probe pad configurations as described, such damage may be avoided or at least substantially mitigated to increase yield and/or reliability.

To enhance use of such probe pads 320, one or more probe pads may be coupled to one or more of the largest conductive networks on and/or in interposer 203. For example, conductive network 510 and/or 520 may be a ground network, namely a Vss network. Interposer 203 may have one or more of such ground networks, and thus one or more probe pads 320 may correspondingly be used. Furthermore, for example, one or more of conductive networks 510 and/or 520 may be a supply voltage network. Interposer 203 may have one or more of supply voltage networks, and thus one or more probe pads 320 may correspondingly be used. For purposes of clarity by way of example and not limitation, it shall be assumed that conductive network 510 is a ground network and that conductive network 520 is a supply voltage network.

There may be many ground connections, namely multiple micro bumps 204 of array 340, coupled to ground network 510. There may be many supply voltage connections, namely multiple other micro bumps 204 of array 340, coupled to supply voltage network 520. Effectively, this means that by at least coupling a single probe pad 320 to a substantially large conductive network of interposer 203, such as ground network 510 for example, a substantial portion of surface 211 of interposer 203 is grounded by touching grounded probe 590 to such single ground probe pad. Optionally, for further protection, or possibly instead of using ground network 510, by at least coupling a single probe pad 320 to a substantially large conductive network of interposer 203, such as supply voltage network 520 for example, a substantial portion of surface 211 of interposer 203 is grounded by touching grounded probe 590 to such single probe pad. Generally, a largest conductive network that covers a large area with respect to surface 211 may be coupled to a probe pad 320 for providing a reference ground on interposer 203 for die attach or for a die that is to be attached. An interposer 203 may have a front side surface 211 which is substantially larger than any area of any die 202 coupled thereto. Thus, by having a wide spread network to provide a reference ground, likelihood of significant damage due to surface charge discharge over such a large surface area of interposer 203 is substantially reduced. While there may be pockets of small surface charges remaining, dies 202 may have ESD devices that are sufficiently robust to withstand such small surface charges.

The density of array 340 is substantial; and micro bumps 204 are small and soft. Accordingly, it may take specialized equipment to contact an individual ground micro bump 204 or a plurality of such micro bumps 204 with a specialized probe pin for the task. Use of the larger probe pad 320 may avoid the need and cost of such specialized equipment. Thus, a dummy probe pad 320 may be used, where such probe pad 320 is not used for grounding a stacked die IC 200 after completed assembly thereof. However, a "real" probe pad 320 may likewise be used, namely a probe pad of a stacked die IC 200 that is used for grounding after completed assembly of such stacked die IC.

FIG. 5-2 is an exemplary portion 500 of an interposer. Portion 500 of FIG. 5-2, like FIG. 5-1, can represent a portion of interposer 203, which may be part of interposer wafer 300 as described with reference to FIG. 3. FIG. 5-2 is substantially similar to FIG. 5-1 and, as such, descriptions of like numbered elements generally are not repeated. Unlike FIG. 5-1, however, TSVs 208 in FIG. 5-2 extend completely, or entirely, through substrate 560. Accordingly, one or more barrier layers 402 and dielectric layer 401 also extend entirely through substrate 560.

Figure 6:
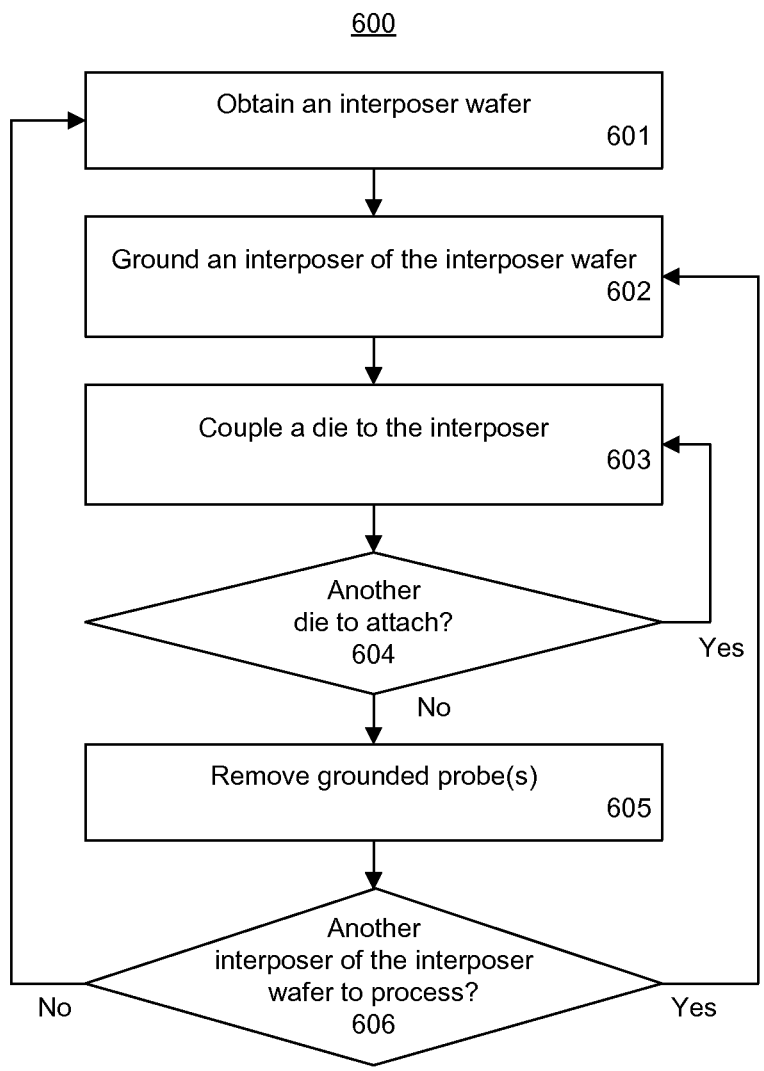
FIG. 6 is a flow chart illustrating an exemplary method of creating a stacked die IC.

FIG. 6 is a flow chart illustrating an exemplary method 600 of creating a stacked die IC. For example, method 600 can be used to create a stacked die IC as illustrated and described with reference to FIG. 2-2 or 2-3.

In block 601, method 600 is initiated by obtaining an initial interposer wafer 300. It is assumed that interposer wafer 300 has already been through a wafer sort, where all interposers 203 of interposer wafer 300 may be tested. Any interposer 203 not passing such wafer sort test may be identified, so as not to use such interposer for die attach. In block 602, an interposer 203 of interposer wafer 300 is grounded. For example, at least one grounded probe 590 is put in mechanical contact with at least one corresponding probe pad 320 of interposer 203. This mechanical probing, which may be automatically carried out by a machine, with a grounded probe 590 by contacting a dedicated probe pad 320, may remove or dissipate electrostatic charge from such interposer 203 having dedicated probe pad 320. This provides a reference ground for a front side surface 211 of interposer 203, as previously described.

In block 603, a die 202, such as a known good die for example, is coupled to the interposer grounded in block 602. Thus, this coupling of a die 202 is performed while interposer 203 is grounded by at least one grounded probe 590 as described with reference to block 602. Such coupling may be through a portion of array 340.

In block 604, it may be determined whether there is another die 202 to be coupled to interposer 203 grounded in block 602. If it is determined in block 604 that there is another die 202 to be coupled to the interposer, then in block 604 the other die is obtained for coupling in block 603. Such other die 202 may be attached to interposer 203 while maintaining grounding thereof to provide a stacked die 200. If, however, it is determined in block 604 that there is not another die 202 to be coupled to such interposer, then in block 605 one or more grounded probes 590 used to ground the interposer of block 602 may be removed from mechanical contact with one or more corresponding probe pads 320.

In block 606, it may be determined whether there is another interposer 203 of interposer wafer 300 obtained in block 601 in order to form another stacked die IC 200. In block 606, such other interposer 203 may be determined with testing information from a wafer sort of interposer wafer 300. If in block 606 it is determined that there is another interposer 203 of such interposer wafer 300 to process, then in block 606 such other interposer 203 is accessed for grounding in block 602. Accordingly, a machine used to perform die attach may move one or more grounded probes 590 from one interposer to another interposer of a same interposer wafer for grounding thereof in block 602. If, however, in block 606 it is determined that there is no other interposer 203 of interposer wafer 300 to process, then the machine, in block 606, may unload the previously processed wafer for forming stacked die ICs 200 and load another interposer wafer 300 in block 601 for forming more stacked die ICs 200, as previously described.

Stacked die ICs 200 implemented using an interposer 203 may be diced therefrom to provide separated stacked die ICs 200. Method 600 was described for a Chip-on-Wafer process flow. However, rather than loading interposer wafers in block 601, an individual interposer 203 may be loaded for method 600 to be a Chip-on-Chip process flow. Thus, in block 606 it would be determined whether there was another interposer 203 to process, and if there was not, then method 600 may end.

Figure 7:
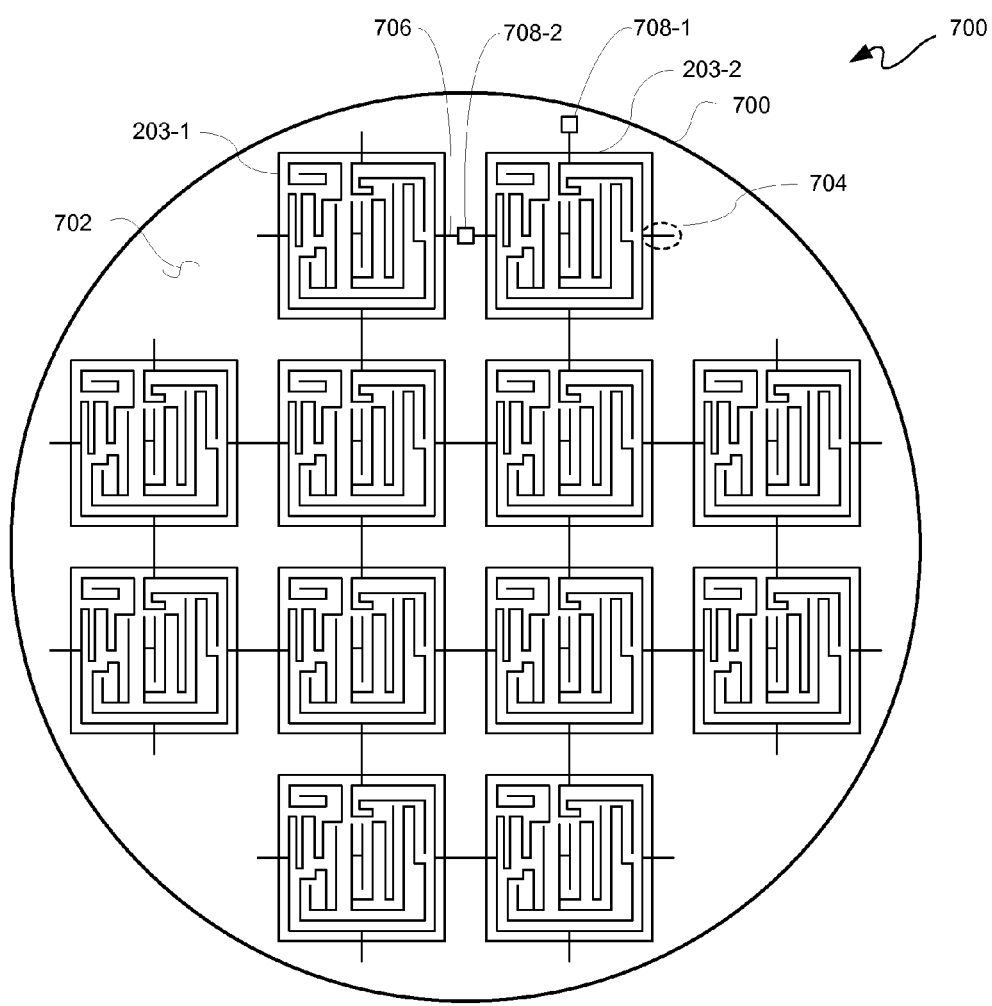
FIG. 7 is a block diagram illustrating a top view of another exemplary interposer wafer.

FIG. 7 is a block diagram illustrating a top view of another exemplary interposer wafer 700. Interposer wafer 700 includes a plurality of interposers 203. A front side surface 702 of interposer wafer 700 is pictured in FIG. 7.

For purposes of illustration, each of interposers 203 is shown having a patterned metal layer implemented therein. The patterned metal layer illustrated in each of interposers 203 of interposer wafer 700 may be implemented beneath one or more other process layers when each of interposers 203 is fully formed and, as such, be obstructed from view. FIG. 7 illustrates the patterned metal layers of interposers 203 to better illustrate how one or more patterned metal layers of a plurality of different interposers 203 are interconnected on interposer wafer 700. For example, the patterned metal layers illustrated may be formed of metal layer 551 of FIG. 5 with one or more other layers formed above. For purposes of illustration, FIG. 7 presumes such additional layers are transparent to better illustrate various aspects disclosed within this specification.

As shown, a patterned metal layer of each of interposers 203 is connected to one or more metal stubs 704. In one aspect, metal stubs 704 are formed as part of the patterned metal layer illustrated in each interposer 203. As pictured, metal stub 704 extends beyond the perimeter of interposer 203 into a scribe region of interposer wafer 700. Each interposer 203 can include a patterned metal layer having one or more metal stubs 704 that, when aligned with a metal stub 704 of an adjacent one of interposers 203, whether to the left, right, above, or below as shown in FIG. 7, forms a metal connection 706 located in the scribe region of interposer wafer 700.

By creating metal stubs 704 for adjacent ones of interposers 203, metal connections 706 are created through scribe regions of wafer 700 that connect one or more patterned metal layers of interposers 203 of interposer wafer 700. In one aspect, connecting the metal layer(s) of interposers 203 of interposer wafer 700 forms a "global wafer network." As used within this specification, the phrase "global wafer network" means a network formed of one or more patterned metal layers of two or more interposers within the same interposer wafer, wherein the patterned metal layer(s) of each interposer are electrically and physically coupled by one or more metal connections implemented through a scribe region or scribe regions of the interposer wafer. In one aspect, a global wafer network is a network that includes one or more patterned metal layers of each interposer of the same wafer.

In one arrangement, the patterned metal layer(s) of interposers 203 that are connected to form the global wafer network are the largest conductive networks on and/or in interposers 203. For example, the patterned metal layer(s) of each interposer 203 that are connected can be part of the ground (Vss) network in each respective interposer 203. The connecting of ground networks in interposer wafer 700, however, is not intended to be a limitation. Other networks of interposers 203 can be inter-connected such as supply voltage (Vcc) networks to form the global wafer network.

Interposer wafer 700 further includes one or more probe pads 708. In one aspect, probe pad 708, i.e., 708-1, is coupled to a metal stub 704. In another aspect, a probe pad 708-2 is coupled to a metal connection such as metal connection 706. In either case, however, probe pad 708 is implemented within the scribe region of interposer wafer 700. While probe pad 708 can be implemented as a portion of metal or other conductive material formed separately from metal stub 704 and/or metal connection 706, in another aspect, probe pad 708 can be formed as an integrated, or continuous, part of metal stub 704 and/or metal connection 706.

By coupling probe pad 708 to a substantially large conductive network across each of interposers 203, e.g., the ground network, a substantial portion of surface 702 of interposer wafer 700 is included within the global wafer network and is grounded by touching a grounded probe to probe pad 708-1 and/or probe pad 708-2. Optionally, for further protection, or possibly instead of using the ground networks, the metal layers from each of interposers 203 that are connected to form the global wafer network are part of the supply voltage network. As noted, the largest conductive network that covers a large area of each interposer 203 may be coupled to a probe pad 708 for providing a reference ground for interposer wafer 700 and each interposer 203 having a metal layer included as part of the global wafer network. The reference ground is further provided for a die that is to be attached to any of interposers 203. By having a global wafer network to provide a reference ground, the likelihood of significant damage due to surface charge discharge is substantially reduced. Again, while there may be pockets of small surface charges remaining, dies 202 may have ESD devices that are sufficiently robust to withstand such small surface charges.

Because probe pad 708 is not implemented on any one of interposers 203, a grounded probe can remain in contact with probe pad 708 (e.g., either probe pad 708-1 or 708-2) through the entire die attachment process for each of interposers 203 of interposer wafer 700. As such, one or more dies 202 can be attached to each of interposers 203 of interposer wafer 700 without having to lift the grounded probe from probe pad 708 and/or relocate the grounded probe from one interposer 203 to another interposer 203 of interposer wafer 700 as described with reference to FIGS. 3 and 6. Such is the case as the global wafer network requires only a single point of contact with a grounded probe in order to ground each interposer 203 of interposer wafer 700.

Figures 1, 8:
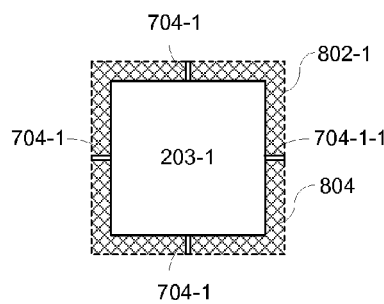
Figures 2, 8:
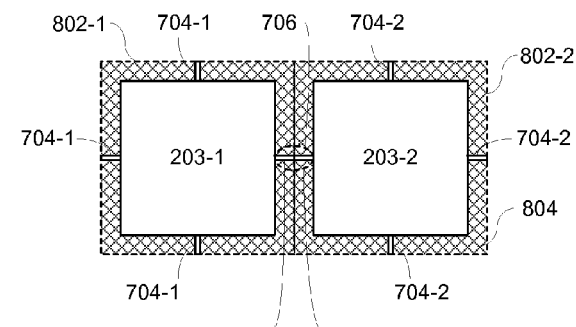
Figures 3, 8:
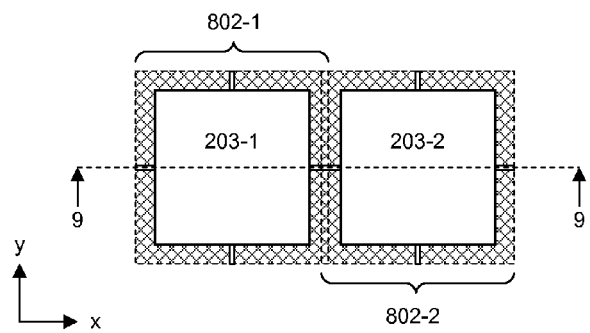

FIGS. 8-1, 8-2, and 8-3, taken collectively, illustrate exemplary techniques for forming a metal connection between adjacent interposers in an interposer wafer. FIG. 8-1 is a topographical view of a portion of interposer wafer 700 of FIG. 7. Region 802-1, illustrated with a dotted line encompassing interposer 203-1, represents the area or portion of interposer wafer 700 that is exposed through a reticle to create a patterned layer during formation of interposer 203-1. In this example, the pattern created in region 802-1 using the reticle corresponds to a patterned metal layer including any necessary metal stubs 704-1 as part of the patterned metal layer within interposer 203-1. For purposes of clarity and illustration, the actual pattern formed within the perimeter of interposer 203-1 is not illustrated. As shown, metal stubs 704-1 extend beyond the perimeter of interposer 203-1 into scribe region 804 of interposer wafer 700 to the border of region 802-1. Scribe region 804 of interposer wafer 700 represents any portion of interposer wafer 700 that is external to the perimeter of an interposer 203. In the example of FIG. 8-1, scribe region 804 is illustrated with cross-hatching.

As pictured, interposer 203-1, and thus the patterned metal layer being implemented, is sized smaller than region 802-1. This facilitates creation of one or more metal stubs 704-1 on one or more or all sides of interposer 203-1 as shown. Metal stubs 704-1 are formed as part of the patterned metal layer, but extend beyond interposer 203-1 into scribe region 804. Once region 802-1 is exposed using the reticle, a stepper moves the reticle either up, down, left, or right to a new location on interposer wafer 700 corresponding to a next or different interposer 203.

FIG. 8-2 is a topographical view of a portion of interposer wafer 700 of FIG. 7. Region 802-2, illustrated with a dotted line encompassing interposer 203-2, represents the area or portion of interposer wafer 700 that is exposed through a reticle to create a pattern for formation of a layer of interposer 203-2. The pattern created in region 802-2 using the reticle in this example also corresponds to a patterned metal layer including any necessary metal stubs 704-2 that couple to the patterned metal layer within interposer 203-2. More particularly, the same pattern metal layer formed in interposer 203-1 is formed in interposer 203-2. Metal stubs 704-2 are formed as part of the patterned metal layer being created for interposer 203-2. As shown, metal stubs 704-2 extend beyond the perimeter of interposer 203-2 and into scribe region 804 of interposer wafer 700 to the border of region 802-2. In the example of FIG. 8-2, scribe region 804 again is illustrated with shading.

As pictured, interposer 203-2, and thus the patterned metal layer being implemented therein, is sized smaller than region 802-2. This facilitates creation of one or more metal stubs 704-2 on one or more or all sides of interposer 203-2 as shown. Once region 802-2 is exposed using the reticle, a stepper moves the reticle either up, down, left, or right to a new location corresponding to a different interposer on interposer wafer 700. The process continues until each of interposers 203 of wafer 700 have been exposed to create a patterned metal layer. As shown, metal stubs 704 of adjacent ones of interposers 203 align with one another to form metal connection 706 between the two adjacent interposers.

Referring to FIG. 8-2, for example, metal stub 704-1-1 of interposer 203-1 aligns and makes contact with metal stub 704-2-1 of interposer 203-2 to form metal connection 706. In the example illustrated in FIG. 8-2, metal stubs 704-1-1 and 704-2-1 can be formed so that each extends into scribe region 804 and abuts or makes contact with the other. In this regard, metal stub 704-1-1 and metal stub 704-2-1 do not overlap. Metal stubs 704-1-1 and 704-2-1 do not overlap since regions 802-1 and 802-2 do not overlap from movement of the stepper. The reticle can be stepped to create further patterned metal layers for other interposers above and below interposers 203-1 and 203-2 so that the metal stubs of interposers above and/or below abut and contact those of interposers 203-1 and 203-2 thereby forming the global wafer network. Metal stub 704-1-1 and 704-2-1 form a continuous metal connection between the patterned metal layer of interposer 203-1 and interposer 203-2 through scribe region 804.

As an example, consider the case in which the reticle, or scan window, for interposer wafer 700 is 26×33 mm. Each of interposers 203 can be sized smaller, e.g., at 20×20 mm. The reticle can be stepped or moved in increments of 20.1×20.1 mm. This movement provides a 0.1 mm scribe region between adjacent interposers. Metal stubs 704 can be approximately 60-70 microns long. The width of metal stubs 704 can be relatively thick in comparison with metal line widths within each of interposers 203. For example, a metal stub 704 can be anywhere from approximately 1 to 10 microns in width depending upon the design rules of the fabrication technology being used. Those skilled in the art will appreciate that the double exposure technique described can be readily performed particularly since metal subs 704 and resulting metal connections 706 in scribe region 804 are not fine metal lines.

FIG. 8-3 is a topographical view of a portion of interposer wafer 700 of FIG. 7. FIG. 8-3 is similar to FIG. 8-2, with the exception that regions 802-1 and 802-2 do not abut one another. Rather, regions 802-1 and 802-2 overlap one another. When moving the reticle, the stepper positions the reticle with a predetermined amount of overlap with the prior exposed region. As such, metal stubs 704-1-1 and 704-2-1 are aligned vertically along the y-axis, but overlap one another along the x-axis. A similar overlapping can be performed when implementing patterned metal layers of interposers above and/or below (not shown) in different rows of interposer wafer 700 than interposers 203-1 and 203-2. As such, two adjacent interposers in different rows have metal stubs that are aligned in the x-axis and that partially overlap with respect to the y-axis.

Figure 9:
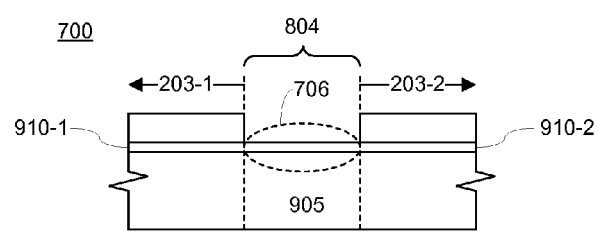
FIG. 9 is a cross-sectional side view of a portion of an interposer wafer.

FIG. 9 is a cross-sectional side view of a portion of an interposer wafer. More particularly, FIG. 9 is a cross-sectional side view of the portion of interposer wafer 700 illustrated in FIG. 8-3 taken along cut line 9-9. As shown, the portion of wafer 700 includes a substrate 905. Substrate 905 can be implemented substantially as described for an interposer (and interposer wafer) with reference to FIG. 5, for example.

FIG. 9 illustrates that a patterned metal layer 910-1 within interposer 203-1, metal connection 706, and a patterned metal layer 910-2 within interposer 203-2 can be formed of a continuous layer of metal 910 formed throughout interposer wafer 700. As another example, metal layer 910-2 can be similar, or the same as, metal layer 551 of FIG. 5. Within interposer 203-1, patterned metal layer 910-1 can be connected by vertical conductors, e.g., vias, to one or more other metal layers that are part of the same network, e.g., Vss and/or Vcc. Similarly, within interposer 203-2, patterned metal layer 910-2 can be connected to one or more other patterned metal layers of the same network.

In one aspect, because metal connection 706 is severed when interposer wafer 706 is diced into multiple individual interposers 203, the area in scribe region 804 need not be built up in the same manner as other portions of interposer wafer 700 that correspond to interposers 203. More particularly, once a metal connection 706 is formed between adjacent interposers 203, metal connection 706 need not be covered by insulating layers. Metal connection 706 can be left exposed thereby facilitating probing and grounding of the global wafer network from any of metal connections 706 between adjacent interposers 203 or from a metal stub 704 located on a periphery of interposer wafer 700 so long as such metal connection 706 and/or metal stub 704 is sized to form a probe pad to contact a grounded probe.

Figure 10:
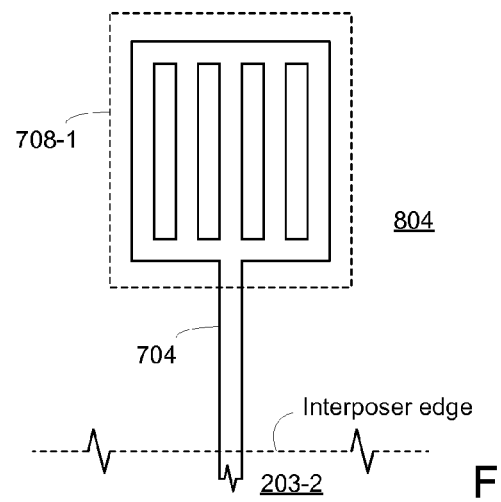
FIG. 10 is a block diagram illustrating a topographical view of an exemplary implementation of a probe pad.

FIG. 10 is a block diagram illustrating a topographical view of an exemplary probe pad. More particularly, FIG. 10 illustrates an exemplary implementation of probe pad 708-1 of FIG. 7. In the example illustrated in FIG. 10, probe pad 708-1 is formed as part of the patterned metal layer within interposer 203-2 and metal stub 704. Because metal stubs 704 are created in scribe region 804 and are not part of interposer 203-2 after interposer wafer 700 is diced, there is substantial freedom in the formation of metal stubs 704 and probe pad 708. In one aspect, for example, a probe pad 708 can be created as a wider metal trace that is sized to make contact with a grounded probe. The size of a metal stub and a probe pad 708 implemented as a metal trace is limited only by the particular design rules of the IC fabrication technology used to create interposer wafer 700. For example, probe pad 708 and/or metal stub 704 can be implemented with relatively thick and/or coarse metal lines. Exemplary widths of metal stubs 704 can be 1, 2, 3, 4, 5 . . . 10 microns depending upon the design rules involved.

In cases where the maximum width of a metal line is not wide enough for a grounded probe to make mechanical contact, probe pad 708-1 can be formed as an array of metal lines as pictured in FIG. 10. Again, because probe pad 708-1 is implemented in scribe region 804, a specific probe pad structure as previously described with reference to FIG. 5, for example, need not be formed. Rather, the same metal layer used to create metal stub 704 can be used or continued to create probe pad 708-1 as an array of metal lines. Appreciably, if one or more metal stubs 704 are formed as illustrated in FIG. 10, then a probe pad 708-1 is formed on an end of each such metal stub 704 opposite the end of metal stub 704 that is coupled to interposer 203.

Figure 11:
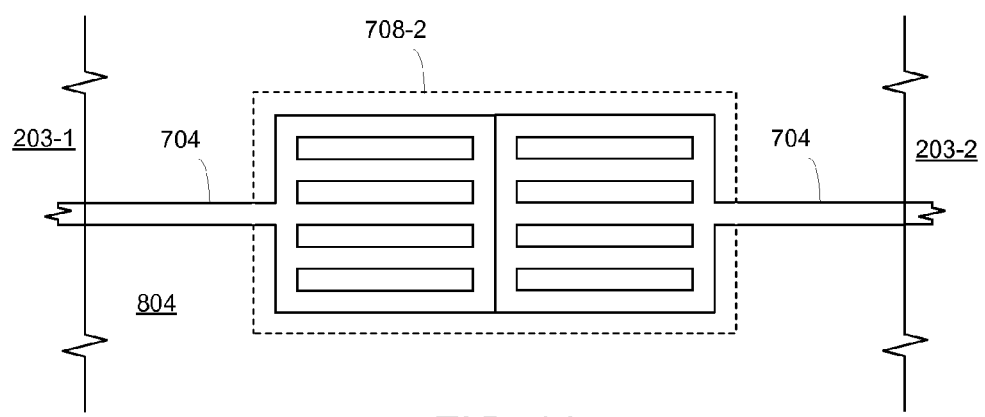
FIG. 11 is a block diagram illustrating a topographical view of another exemplary implementation of a probe pad.

FIG. 11 is a block diagram illustrating a topographical view of another exemplary probe pad. More particularly, FIG. 11 illustrates an exemplary implementation of probe pad 708-2 in which probe pad 708-2 is formed as part of the patterned metal layers of interposers 203-1 and 203-2. In this example, the end of each of two metal stubs 704 extending from interposer 203-1 and interposer 203-2 contact one another to form a larger probe pad 708-2. Appreciably, as discussed, probe pad 708-2 can be formed by abutting two metal stubs 704 as shown or by overlapping two metal stubs 704.

The probe pads illustrated in FIGS. 10 and 11 are shown for purposes of illustration only. A probe pad located within the scribe region can be formed of one or more IC structures as illustrated and electrically connected to patterned metal layers of interposers 203. The embodiments described herein that include a global wafer network provide the added benefit of not having to make substantial changes to masks used to implement interposers within interposer wafer 700. By making only slight variations to a mask or reticle of a metal layer, a global wafer network is implemented within interposer wafer 700 without incurring any substantial cost and/or redesign of the interposer itself.

Figures 12, 13:
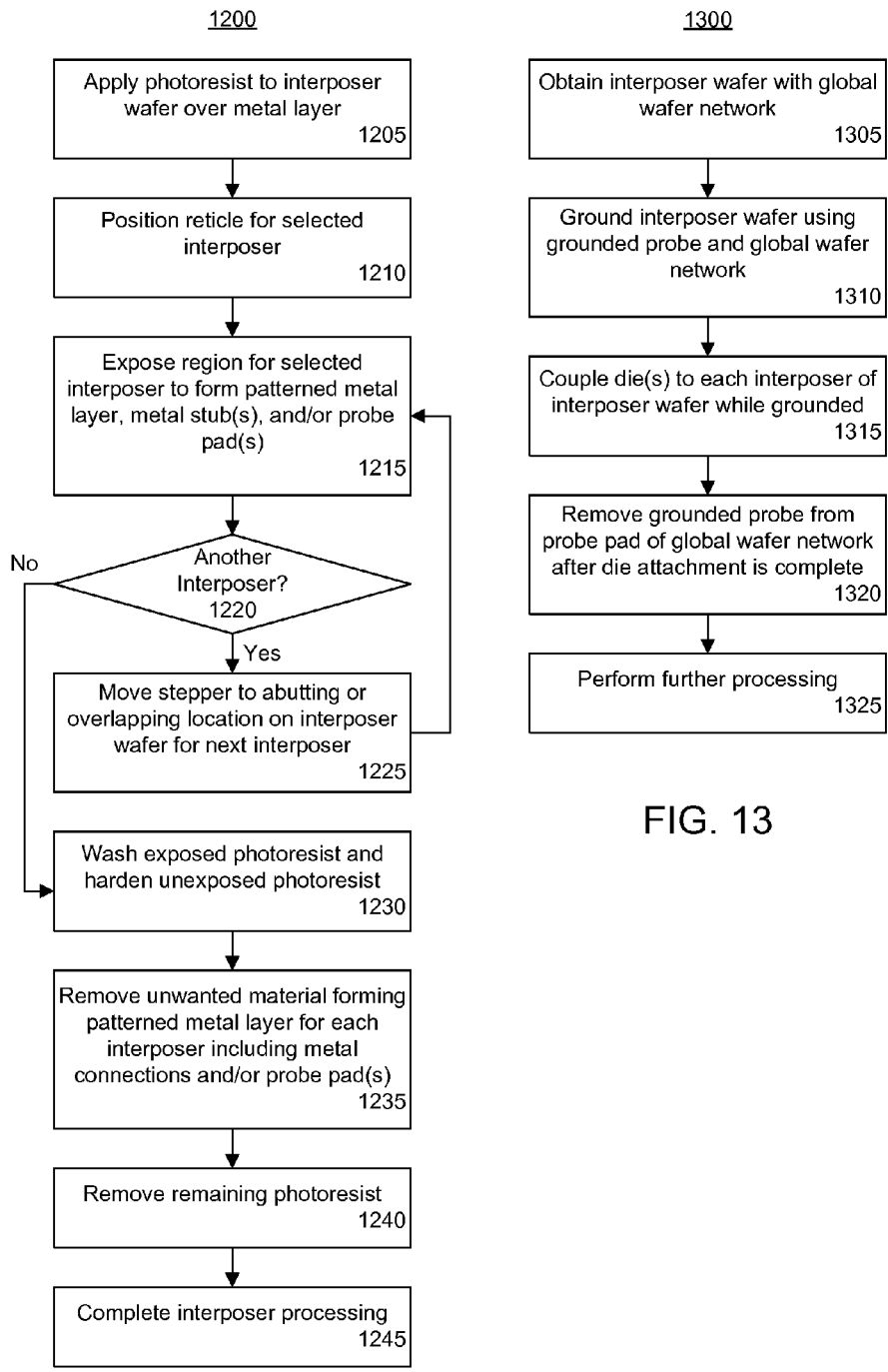
FIG. 12 is a flow chart illustrating an exemplary method of creating an interposer wafer having a global wafer network.
FIG. 13 is a flow chart illustrating another exemplary method of creating a stacked die IC.

FIG. 12 is a flow chart illustrating an exemplary method 1200 of creating an interposer wafer having a global wafer network. For purposes of illustration, the formation of one patterned metal layer within the wafer is described. It should be appreciated that one or more other layers of the interposers within the interposer wafer can be formed prior to formation of the global wafer network or subsequent thereto. Further, more than one patterned metal layer within each interposer can be electrically connected using vias to become part of the global wafer network.

Method 1200 can begin in a state where a metal layer has been applied to interposer wafer 700 while undergoing processing. The metal layer will form at least one patterned metal layer within each interposer 203 of interposer wafer 700 to implement the global wafer network. It should be appreciated that while interposers 203 of interposer wafer 700 are not fully formed, such structures are referred to as interposers 203 and/or as a region for an interposer 203.

In block 1205, photoresist is applied to the metal layer of interposer wafer 700. In block 1210, a reticle is positioned for a selected interposer. The reticle has an image for the patterned metal layer that is to be implemented within each interposer 203 of interposer wafer 700. In block 1215, the region for the selected interposer 203, e.g., the region of interposer wafer 700 that is sized according to the reticle and which encompasses the selected interposer 203, is exposed to ultraviolet light. Accordingly, those portions of the reticle that are transparent expose the photoresist beneath to the ultraviolet light. Those portions of the reticle that are opaque prevent exposure of the photoresist beneath. The pattern to be implemented within the metal layer is applied to the photoresist for the selected interposer. As noted, the resulting pattern not only specifies the patterned metal layer of the interposer, but also any metal stubs extending therefrom into the scribe region of interposer wafer 700 and/or probe pads.

In block 1220, a determination is made as to whether another interposer of interposer wafer 700 remains to be processed. More particularly, a determination is made as to whether another region corresponding to an interposer of interposer wafer 700 requires exposure using the current reticle. The next interposer, or region for an interposer, to be processed may be in the same row, e.g., a location adjacent to the current location in a same row, or in a different row. If another interposer remains to be processed, method 1200 continues to block 1225. If not, method 1200 proceeds to block 1230.

In block 1225, the stepper moves the reticle to the next location which corresponds to a region encompassing another, or the next, interposer. As noted, the next region can be positioned to either abut or overlap the prior region. After block 1225, method 1200 loops back to block 1215 to continue processing and expose the region to apply the pattern of the reticle to the photoresist.

Continuing with block 1230, in the case where the pattern of the reticle has been applied to each region corresponding to an interposer of interposer wafer 700, the exposed photoresist is washed. Further, the unexposed photoresist is hardened. In block 1235, the unwanted portions of the metal layer are removed leaving a patterned metal layer for each interposer 203 of interposer wafer 700. As discussed, for each interposer 203 of interposer wafer 700, the resulting patterned metal layer includes one or more metal stubs that extend into the scribe region and couple to form metal connections and/or probe pad(s).

In block 1240, the remaining photoresist is removed. Accordingly, interposer wafer 700 includes a global wafer network in which at least one patterned metal layer in each interposer 203 of interposer wafer 700 is interconnected using the metal connections. In block 1245, any further interposer processing may be performed. For example, one or more additional layers may be added and/or created, etc.

FIG. 12 has been described using a positive photoresist as an example. It should be appreciated that the global wafer network also can be formed using a negative photoresist or any suitable IC manufacturing technology. The inventive arrangements disclosed within this specification are not intended to be limited by the particular type of IC fabrication technology used.

FIG. 13 is a flow chart illustrating another exemplary method 1300 of creating a stacked die IC. More particularly, FIG. 13 illustrates an exemplary method of attaching dies to interposers while still in wafer form. Accordingly, method 1300 can begin in a state where interposer wafer 700 includes completed interposers 230 and further includes a global wafer network as previously described.

In block 1305, interposer wafer 700 having a plurality of complete interposers 203 is obtained. As noted, interposer wafer 700 includes a global wafer network implemented therein. In one aspect, interposer wafer 700 has been subjected to a wafer sort where all interposers 203 of interposer wafer 700 may be tested. Any interposer 203 not passing such wafer sort test may be identified, so as not to use such interposer for purposes of attaching dies thereto.

In block 1310, interposer wafer 700 is grounded by placing a grounded probe in mechanical contact with the global wafer network. In one aspect, the grounded probe can be placed in mechanical contact with a probe pad coupled to the global wafer network. It should be appreciated, however, that since metal of the global wafer network can remain exposed between each pair of adjacent interposers and at the periphery of each interposer, special ground and/or probe pads need not be implemented. Rather, portions of exposed metal can be patterned as a structure of sufficient size, referred to as a probe pad, so that a grounded probe can make mechanical contact therewith. As part of grounding, interposer wafer 700, and correspondingly each interposer 203 therein, is discharged.

In block 1315, any dies that are to be attached or coupled to each interposer 203 of interposer wafer 700 can be so attached while the grounded probe remains in mechanical contact with the global wafer network. In block 1320, the grounded probe can be removed or disconnected from the global wafer network after die attachment is complete.

In block 1325, one or more further processing steps can be performed. For example, additional testing can be performed for each resulting stacked die IC, the wafer can be diced into a plurality of stacked die ICs, the resulting stacked die ICs can be packaged, etc.

This specification describes various arrangements for grounding interposer(s) for purposes of die attachment when assembling a stacked die IC. Various probe pad implementations are described that facilitate the safe discharge of accumulated electrostatic charge and the grounding of interposers for attaching dies thereto. In one or more aspects, probe pads are incorporated into each respective interposer. As such, a grounded probe is placed in mechanical contact with one or more of the probe pads of each interposer prior to and/or during die attachment.

In one or more other aspects, a global wafer network is implemented that does not require probe pads to be implemented as part of the interposers. Rather, the probe pads can be formed within the scribe region an interposer wafer. The latter allows a grounded probe to discharge and ground each interposer of an interposer wafer via a single mechanical contact with a probe pad coupled to the global wafer network. The grounded probe does not have to be moved from one interposer to another for safe discharge and grounding of each interposer of an interposer die for die attachment.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The flowcharts and block diagrams in the Figures illustrate the architecture, functionality, and operation of possible implementations of systems and/or methods according to various aspects of the inventive arrangements disclosed herein. It should also be noted that, in some alternative implementations, the functions noted in the blocks may occur out of the order noted in the figures. For example, two blocks shown in succession may be performed substantially concurrently, or the blocks may sometimes be performed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems, e.g., IC manufacturing equipment, that perform the specified functions or acts.

The corresponding structures, materials, acts, and equivalents of all means or step plus function elements in the claims below are intended to include any structure, material, or act for performing the function in combination with other claimed elements as specifically claimed.

The features disclosed within this specification can be embodied in other forms without departing from the spirit or essential attributes thereof. Accordingly, reference should be made to the following claims, rather than to the foregoing specification, as indicating the scope of such features and implementations.

What is claimed is:

1. A wafer, comprising:
    a first interposer comprising a first patterned metal layer;
    a second interposer comprising a second patterned metal layer; and
    a metal connection in a scribe region of the wafer that electrically couples the first patterned metal layer of the first interposer with the second patterned metal layer of the second interposer forming a global wafer network; and
    a probe pad located in the scribe region electrically coupled to the global wafer network;
    wherein each of the first interposer and the second interposer comprise a plurality of conductive networks and an array of microbumps, the first patterned metal layer is one of a supply voltage network or a ground network of the plurality of conductive networks of the first interposer, and the second patterned metal layer is one of a supply voltage network or a ground network of the plurality of conductive networks of the second interposer, the supply voltage network or the ground network of the first interposer and the second interposer being electrically coupled to a plurality of microbumps in the respective array of microbumps, the probe pad configured to remove electrostatic charges from the first interposer and the second interposer through grounding.

2. The wafer of claim 1, wherein the global wafer network comprises a patterned metal layer of each interposer of the wafer connected using metal connections in scribe regions.

3. The wafer of claim 1, wherein the probe pad is coupled to the metal connection.

4. The wafer of claim 1, wherein the probe pad is formed using a same metal layer used to implement the first patterned metal layer, the second patterned metal layer, and the metal connection.

5. The wafer of claim 1, wherein the probe pad is formed of an array of metal lines formed as part of the metal connection.

6. The wafer of claim 1, further comprising:
    a metal stub formed as part of the first patterned metal layer extending into the scribe region;
    wherein the metal stub is coupled to the probe pad.

7. The wafer of claim 1, wherein the probe pad is located at a periphery of the wafer.

8. The wafer of claim 1, wherein each interposer is a passive die.

9. The wafer of claim 1, wherein the metal connection is formed of a first metal stub formed as part of the first patterned metal layer that extends into the scribe region and a second metal stub formed as part of the second patterned metal layer that extends into the scribe region.

10. The wafer of claim 9, wherein the first metal stub abuts the second metal stub in the scribe region.

11. The wafer of claim 9, wherein the first metal stub overlaps the second metal stub in the scribe region.

* * * * *